(12) United States Patent
Shirley

(10) Patent No.: US 6,185,136 B1
(45) Date of Patent: Feb. 6, 2001

(54) METHOD AND APPARATUS FOR REPAIRING DEFECTIVE COLUMNS OF MEMORY CELLS

(75) Inventor: Brian M. Shirley, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/353,575

(22) Filed: Jul. 15, 1999

(51) Int. Cl.$^7$ ....................................................... G11C 7/00
(52) U.S. Cl. ........................ 365/200; 365/202; 365/225.7
(58) Field of Search ..................................... 365/200, 202, 365/225.7, 210, 190

(56) References Cited

U.S. PATENT DOCUMENTS

| | | | |
|---|---|---|---|
| 5,724,282 | * | 3/1998 | Loughmiller et al. .................. 365/96 |
| 5,787,044 | * | 7/1998 | Duesman ............................. 365/200 |
| 5,844,833 | * | 12/1998 | Zagar et al. ........................ 365/149 |
| 5,982,682 | * | 11/1999 | Nevill et al. ........................ 365/201 |

* cited by examiner

Primary Examiner—Vu A. Le
Assistant Examiner—Hien Nguyen
(74) Attorney, Agent, or Firm—Dorsey & Whitney LLP

(57) ABSTRACT

A pair of coupling transistors are connected in series with isolation transistors in each of a plurality of column node circuits coupled to first and second arrays of memory cells arranged in rows and columns. The coupling transistors for the complimentary digit lines in each column node circuit are rendered non-conductive in the event memory cells connected to the coupling transistors through digit lines of the first and second array are defective. As a result, defective memory cells in the first and second arrays are isolated from sense amplifiers in the column node circuits so that the sense amplifiers cannot affect non-defective memory cells.

40 Claims, 6 Drawing Sheets

METHOD AND APPARATUS FOR REPAIRING DEFECTIVE COLUMNS OF MEMORY CELLS

TECHNICAL FIELD

The present invention relates to memory devices, particularly dynamic random access memory devices, and, more particularly, to a method and apparatus for preventing defective columns of memory cells from rendering the entire memory device defective.

BACKGROUND OF THE INVENTION

A conventional memory device is illustrated in FIG. 1. The memory device is a synchronous dynamic random access memory ("SDRAM") 10 that includes an address register 12 adapted to receive row addresses and column addresses through an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20 and 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers in associated column circuits 50 for the arrays 20 and 22.

Data to be read from one of the arrays 20 or 22 are coupled from the arrays 20 or 22, respectively, to a data bus 58 through the column circuit 50, and a read data path that includes a data output register 56. Data to be written to one of the arrays 20 or 22 are coupled from the data bus 58 through a write data path, including a data input register 60, to one of the column circuits 50 where they are transferred to one of the arrays 20 or 22, respectively. A mask register 64 may be used to selectively alter the flow of data into and out of the column circuits 50 by, for example, selectively masking data to be read from the arrays 20 and 22.

The above-described operation of the SDRAM 10 is controlled by a command decoder 68 responsive to high level command signals received on a control bus 70. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

A portion of the column circuits 50 of FIG. 1 is shown in greater detail in FIG. 2. The column circuit 50 is shown connected to a pair of arrays 100, 102, which may be subarrays in either of the arrays 20, 22 shown in FIG. 1. Alternately, a single column circuit 50 containing the circuitry shown in FIG. 2 may be used to access both of the arrays 20, 22 shown in FIG. 1. The column circuit 50 includes a plurality of column node circuits 110a–n in addition to a redundant column node circuit 112. All of these column node circuits 110, 112 are identical, and, in the interest of clarity and brevity, the internal components of only one column node circuit 110a is shown in FIG. 2.

The column node circuit 110a interfaces with two columns of memory cells using two pairs of complementary digit lines $D_0$, $D_0$* and $D_1$, $D_1$*, respectively. However, it will be understood that the column node circuit 110a may contain fewer or greater numbers of complimentary digit line pairs. In the interest of brevity, the digit lines $D_0$, $D_0$* and $D_1$, $D_1$* in the column node circuit 110 as well as in the other column node circuits 110b–n, 112 will sometimes be referred to as simply D and D*. Each digit line pair D, D* has coupled therebetween a negative sense amplifier 120, a positive sense amplifier 122, an equilibration circuit 124, and an I/O circuit 126.

The equilibration circuit 124 is controlled by a precharge control circuit 130 that may be part of the row decoders 28 (FIG. 1) to couple the digit lines D, D* to each other and to an equilibration voltage, which typically has a magnitude equal to one-half the magnitude of a supply voltage. The negative sense amplifier 120 and the positive sense amplifier 122 normally receive respective power signals, typically ground potential and either the supply voltage or a pumped voltage having a magnitude that is slightly greater than the magnitude of the supply voltage, respectively. After the digit lines D, D* have been equilibrated by the equilibration circuit 124, the sense amplifiers 120, 122 detect a voltage imbalance in the digit lines D, D* during a read access of memory cells in the arrays 100, 102. The sense amplifiers 120, 122 then drive the digit lines D, D* in the direction of the imbalance until one of the digit lines is at the supply voltage and the other of the digit lines is at ground potential.

Once the sense amplifiers 120,122 have driven the digit lines D, D* to voltages indicative of the data read from a memory cell in the respective column, the digit lines D, D* are coupled to respective I/O lines I/OA, I/OB* by the I/O circuit 126. As is a well understood in the art, in a read memory access the signals from the digit lines are coupled to a DC sense amplifier (not shown), which applies a corresponding data signal to the data bus of the memory device. The other digit lines $D_1$, $D_1$* in the column node circuit 110a are similarly coupled to a respective pair of I/O lines I/OB, I/OB* by a respective I/O circuit 126.

In a write memory access, the I/O lines are driven by respective write drivers (not shown), and are coupled to the digit lines D, D* by the I/O circuit 126.

The column node circuit 110a receives a SEL_R signal from a respective inverter 114 to cause it to couple its digit lines D, D* to the I/O lines I/O, I/O*, respectively. Similarly, the column node circuit 110b receives a SEL_R+1 signal to couple its digit lines to the same I/O lines, and the column node circuit 110n receives a SEL_R+N signal to couple its digit lines to the same I/O lines. Since the SEL signals select various columns of memory cells in the arrays 100, 102, they are normally generated by the column decoder 48 (FIG. 1).

The I/O circuits 126 in the redundant column node circuit 112 are likewise coupled to the same I/O lines by a select SEL_RED signal, but the SEL_RED signal is generated by a redundant column control circuit 144. The redundant column control circuit 144 may be part of the column decoder 48 (FIG. 1).

As mentioned above, the column node circuits 110a–n, 112 are coupled to both arrays 110, 102. However, the column node circuits cannot receive signals indicative of read data from both arrays 100, 102 at the same time. For this reason, isolation transistors 150, 152 are coupled between each digit line D, D* of the column node circuit and corresponding digit lines D, D*, respectively, of the arrays 100, 102. All of the isolation transistors 150 coupled to the array 100 are turned ON by a common ISO_LEFT signal, and all of the isolation transistors 152 coupled to the array 102 are turned ON by a common ISO_RIGHT signal. Since the arrays 100, 102 contain rows of memory cells corresponding to different row addresses, the ISO_LEFT and ISO-RIGHT signals are typically generated by the row decoders 28 (FIG. 1).

Although the manufacturing yield of memory devices is very good, the large number of transistors, signal paths, and other components, such as capacitors, contained in memory devices creates a significant statistical probability that a memory device will contain at least one defective transistor, signal path or other component. For this reason, memory devices typically incorporate rows and columns of redundant memory cells. If a row or column of memory cells is found to be defective during testing, either before or after packaging the memory device, the memory device can be programmed to substitute a redundant row of memory cells for the defective row, or a redundant column of memory cells for the defective column. The redundant column node circuit 112 is provided to interface with redundant columns of memory cells in the arrays 100, 102. The redundant column node circuit 112 interfaces with two columns of memory cells, so that two redundant columns are substituted whenever a single defective column is found during testing. However, it will be understood that redundant columns can be substituted on a column-by-column basis, or that redundant columns can be substituted in groups larger than two. The number of digit lines D, D* in the redundant column node circuit 112 can be adjusted as desired to match the number of redundant columns that are substituted.

Redundant columns of memory cells markedly improve the manufacturing yield of memory devices. However, there are some defects that can occur that cannot be repaired by substituting a redundant column. For example, with reference to FIG. 3, a portion of the arrays 100, 102 includes access transistors 160 coupled between respective digit lines D, D* and a respective storage capacitor 162. Each access transistor 160 selectively couples a digit line D or D* to one plate of the storage capacitor 162. The other plate of the storage capacitor is a "cell plate" that is typically coupled to a voltage having a magnitude of one-half of the supply voltage. In operation, the storage capacitors 162 store voltages indicative of either a logic "0" or a logic "1".

The cell plate of each capacitor 162 is typically common to all of the storage capacitors 162. As a result of manufacturing defects, one of the digit lines D or D* may be shorted to the cell plate either directly (the usual failure mode) or through a shorted storage capacitor 162. During testing of the memory device, this defect will be detected, and a redundant column of memory cells will be substituted for the defective column. However, the sense amplifiers 120, 122 in the column node circuit 110 for the defective column normally continue to receive the NLAT and PSENSE signals from the row decoder 28. The sense amplifiers 120, 122 can thus couple the cell plate to either the supply voltage or ground potential thereby rendering the remainder of the memory cells defective.

Although this problem has been recognized in the past, none of the approaches that have been developed to deal with this problem are entirely satisfactory. One approach has been to selectively decouple the NLAT and PSENSE signals from the column node circuit 110 for the defective column of memory cells. Although this approach does prevent a shorted storage capacitor from rendering the remaining cells defective, it does so at great expense. The transistors that are used to selectively couple the NLAT and PSENSE signals to the column node circuits 110 must be physically very large to provide a sufficiently low impedance path to drive the sense amplifiers 120, 122 so that they can respond with sufficient speed. Driving the sense amplifiers 120, 122 through a relatively high impedance markedly slows the ability of the sense amplifiers 120, 122 to sense voltages on the digit lines D, D*, thereby reducing the access time of the memory device. The amount of surface area on a semiconductor die consumed by adding a relatively large transistor to each negative sense amplifier 120 and a relatively large transistor to each positive sense amplifier 122 is significant because of the large number of the sense amplifiers 120, 122 in a typical memory device.

Another problem with providing transistors to selectively couple the sense amplifiers 120, 122 to the row decoder 28 is the difficulty of routing signal lines in the memory device. More particularly, it would be necessary to supply each column node circuit 110 with two additional signal lines coupled to the gates of the transistors. However, it would be difficult to route this many signal lines to the column node circuits 110.

Another approach to preventing defective columns of memory cells from affecting other memory cells has been to place a laser fuse between each column node circuit 110 and the digit lines D, D* of the arrays 100, 102 to which they are connected. When a column of memory cells is found to be defective during testing, a redundant column of memory cells is substituted for the detective column, and the laser fuse coupling of the defective column to its column node circuit 110 is severed. While this approach has been satisfactory in the past, it is becoming less so because the minimum laser pitch has not kept up with decreases in digit line pitch. Furthermore, while this approach has been satisfactory for repairing defects found before the memory device has been packaged, it cannot be used for repairing post-packaging defects.

Although these problems have been explained with reference to the SDRAM 10 shown in FIG. 1, it will be understood that the same problems exist with other dynamic random access memories ("DRAMs") including asynchronous DRAMs and packetized DRAMs, such as synchronous link DRAMs ("SLDRAMs") and RAMBUS DRAMs ("RDRAMs").

There is therefore a need for a method and apparatus that can be used to repair post-packaging defects in a manner that prevents defective memory cells in a column from affecting other memory cells and which does not unduly increase the cost of memory devices.

SUMMARY OF THE INVENTION

A method and apparatus for repairing defective columns of memory cells in a memory device does so in a manner that prevents the defective memory cells from adversely affecting non-defective memory cells. In accordance with one aspect of the invention, a plurality of column node circuits are provided, each of which includes at least one pair of complimentary digit lines. Each of the column node circuits also includes a sense amplifier, an equilibration circuit, and an input/output circuit, each of which is coupled between a respective pair of the complimentary digit lines of the column node circuit. A first pair of coupling switches selectively couples each pair of complimentary digit lines in each column node circuit to a pair of complimentary digit lines for a respective column in a first array. A second pair of coupling switches may optionally be provided to selectively couple each pair of complimentary digit lines in each column node circuit to a pair of complimentary digit lines for a respective column in a second array. The coupling switches each have a conductive state determined by a respective column node disable signal, which is generated by a redundant column control circuit. The redundant column control circuit generates the column node disable signals so that the first and second coupling switches coupled to the respective column node circuits are non-conductive responsive to a redundant column of memory cells being substituted for the column of memory cells to which the column node circuit is coupled.

DETAILED DESCRIPTION OF THE INVENTION

Figure 2:
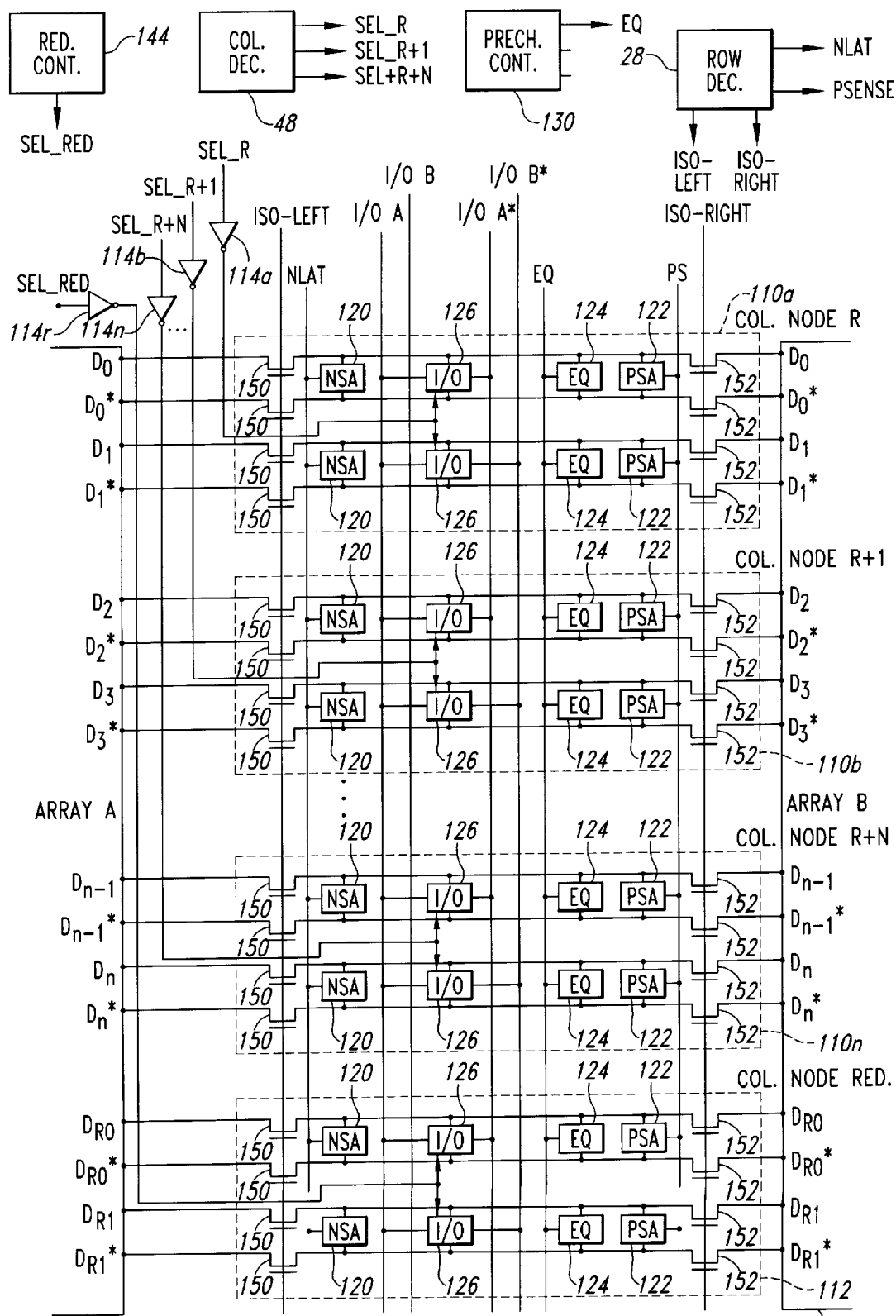
FIG. 2 is a block diagram and schematic diagram of a portion of column circuit used in the SLDRAM of FIG. 1.
Figure 3:
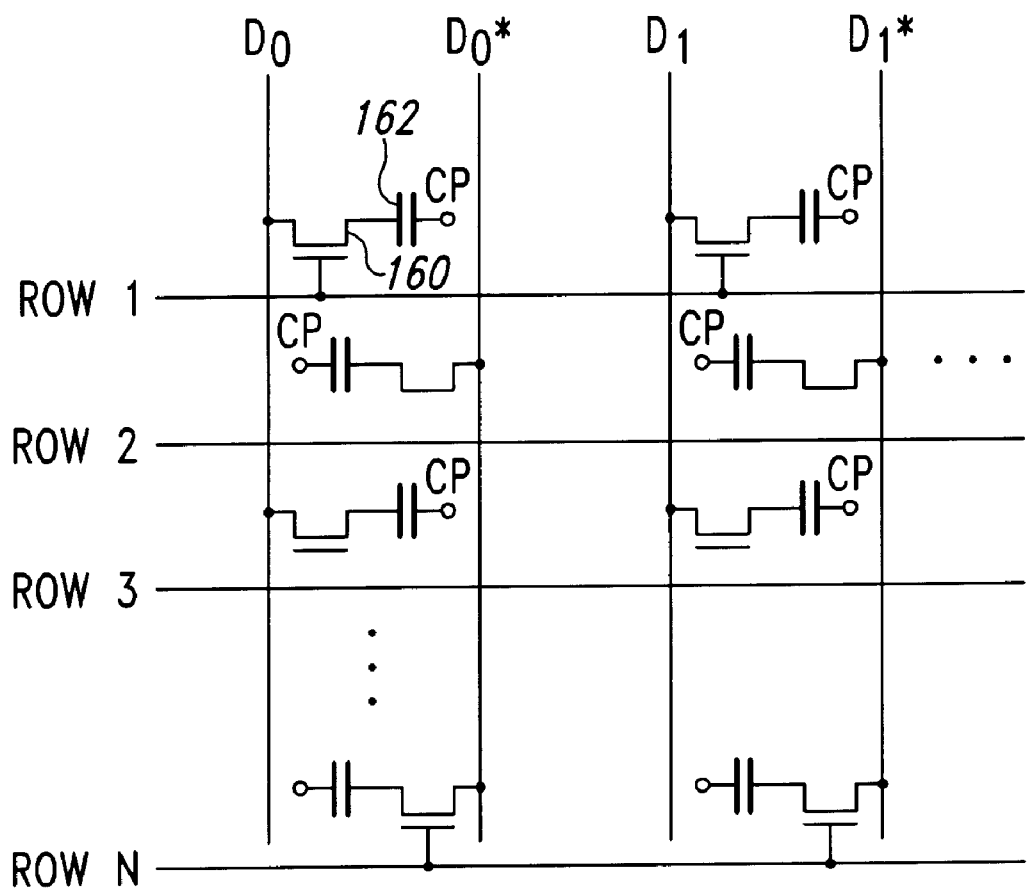
FIG. 3 is a schematic illustrating a portion of memory arrays used in the SLDRAM of FIG. 1, which interface with the circuitry shown in FIG. 2.
Figure 4A:
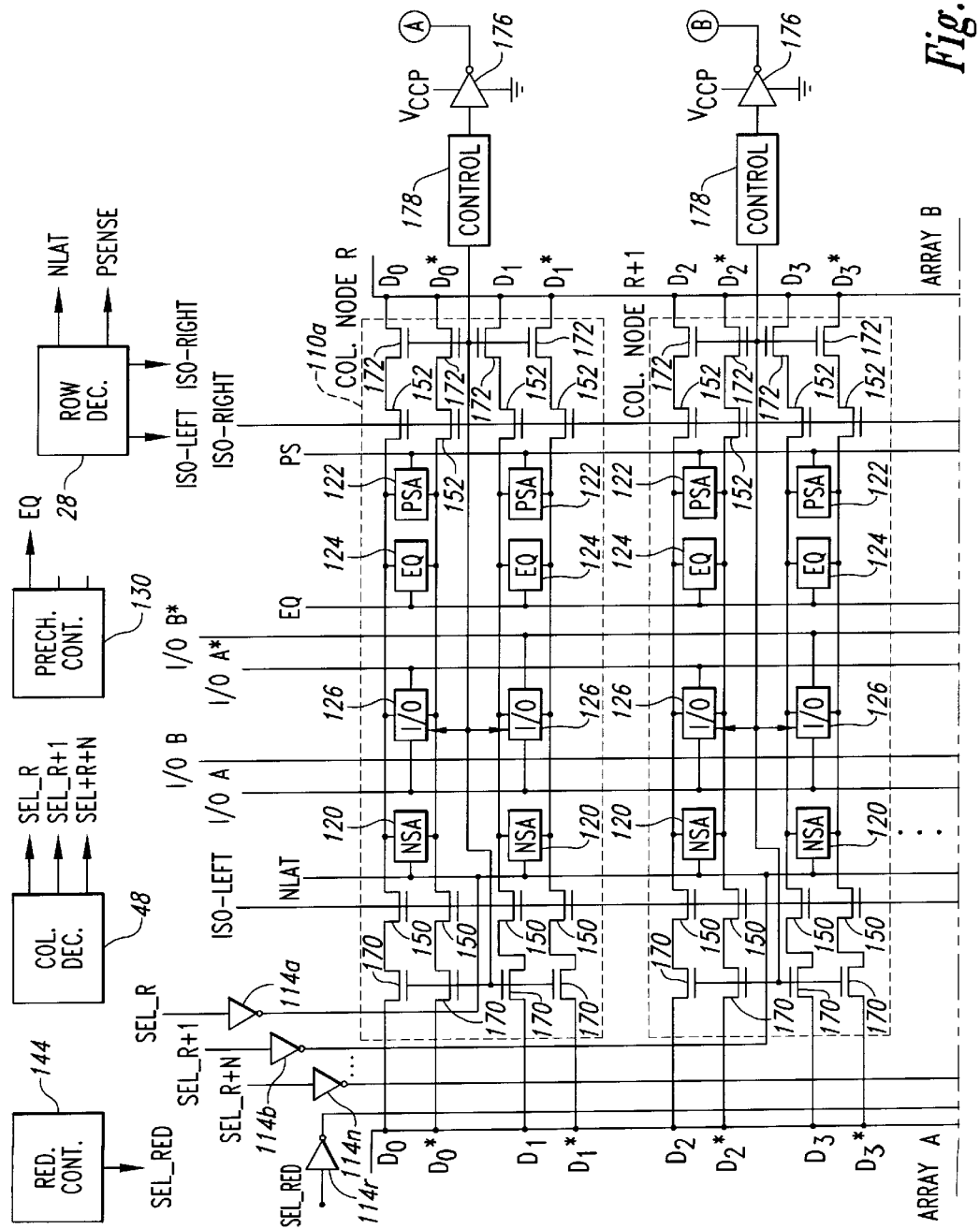
FIGS. 4A and 4B is a block diagram and schematic diagram of one embodiment of circuitry according to the invention that may be used in the SLDRAM of FIG. 1 in place of the column circuitry shown in FIG. 2.
Figure 4B:
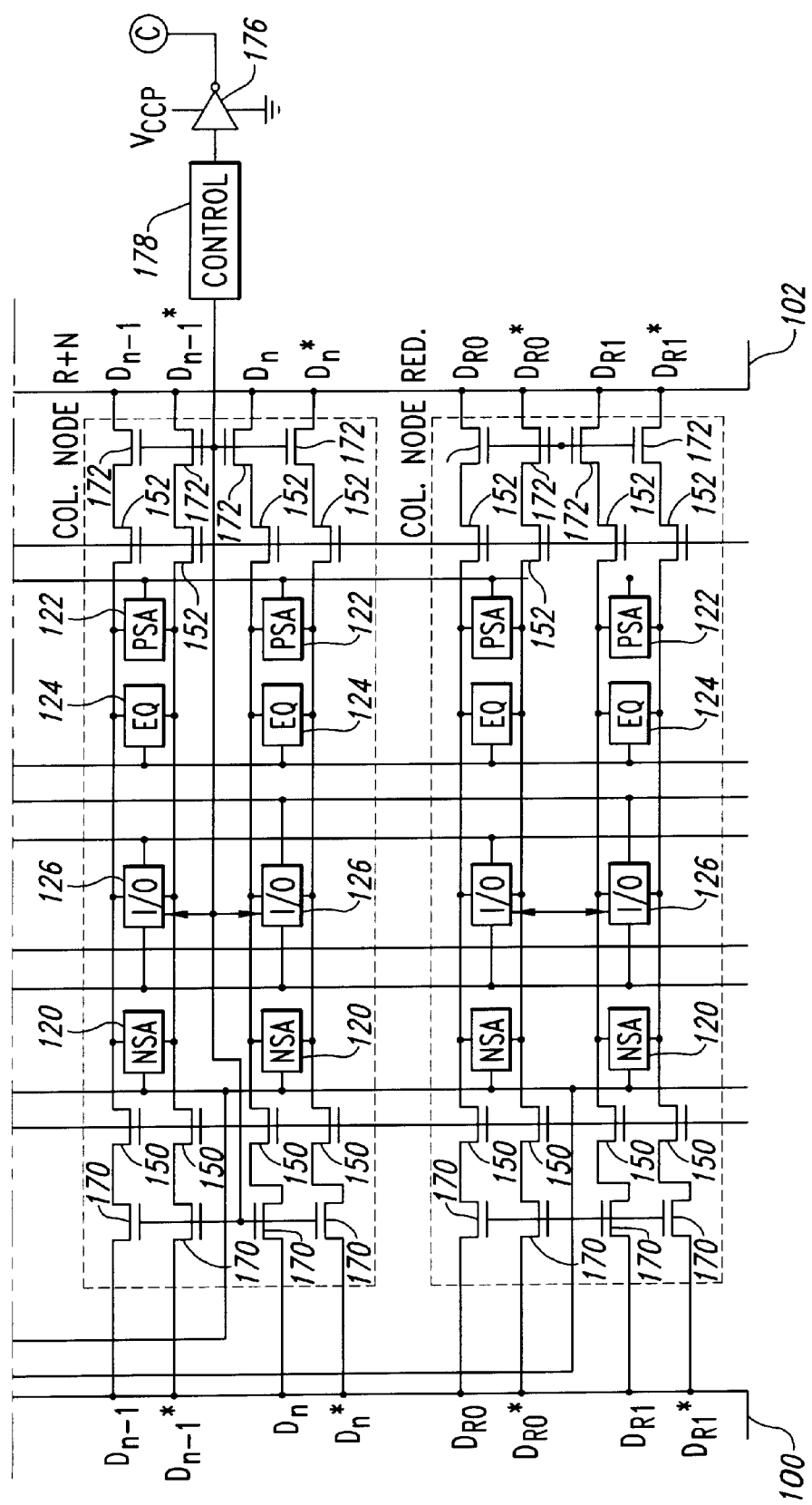

FIGS. 4A and 4B illustrate column circuitry according to one embodiment of the invention that can be used in the column circuit 50. The circuitry shown in FIGS. 4A and 4B uses substantially the same column node circuits 110' used in the prior art column node circuits 110 of FIG. 2. Therefore, in the interest of brevity and clarity, identical components have been provided with the same reference numerals, and their operation will not be repeated.

Figures 5A, 5B:
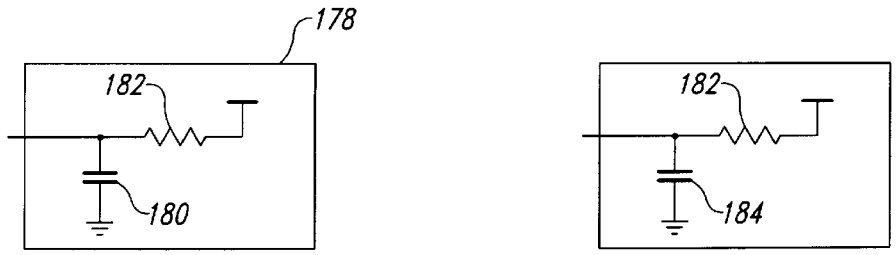
FIGS. 5A and 5B are schematics illustrating various embodiments of control circuitry that may be used in the column circuitry of FIGS. 4A and 4B.

With reference to FIGS. 4B and 4B, each of the column node circuits 110', except for the redundant column node circuit 112, includes a first coupling transistor 170 coupling each of its digit lines D, D* to the first array 100, and a second coupling transistor 172 coupling each of its digit lines D, D* to the second array 102. All of the coupling transistors 170, 172 have their gates connected to each other and to a respective inverter 176. A separate inverter is provided for each of the column node circuits 110'. Power terminals of the inverter 176 are connected to ground and to a pumped voltage Vccp, respectively, so that the inverter 176 outputs one of these two voltages. Each of the inverters 176 is driven by respective control circuitry 178. As shown in FIG. 5A, the control circuitry 178 may be simply a laser fuse 180 biased high by through a resistor 180, or, as shown in FIG. 5B, the control circuitry 178 may be an anti-fuse 184 that is also biased high through a resistor 182. The use of an anti-fuse 182 allows both pre-packaging and post-packaging repairs, while the use of a laser fuse 180 is limited to pre-packaging repairs. Alternatively, the control circuitry 178 may be appropriate circuitry (not shown) that interfaces with the redundant column control circuit 144. For example, if a column is defective, its associated control circuitry 178 may be programmed to compare its column address with each column address received by the memory device. In the event of a match, the control circuitry 178 may output an appropriate signal to the respective inverter 176.

In operation, the control circuitry 178 normally outputs a low thereby causing the inverter 176 to output a voltage of Vccp. The Vccp voltage renders the coupling transistors 170, 172 conductive so that the column node circuit 110' continues to interface with the arrays 100, 102. However, in the event the column of memory for a column node circuit 110' is defective, the control circuitry 178 outputs a high thereby causing the inverter 176 to output a low. The low applied to the respective gates of the coupling transistors 170, 172 renders the transistors 170, 172 non-conductive, thereby isolating the column node circuit 110' from the digit lines in the arrays 100, 102. As a result, the digit lines D, D* in the arrays 100, 102 are decoupled from the sense amplifiers 120, 122 so that a short in a storage capacitor coupled to a digit line D, D* does not allow the sense amplifiers 120, 122 to drive the cell plate to ground or the supply voltage.

If a laser fuse 180 (FIG. 5A) is used in the control circuitry 178, the laser fuse is left unblown in the event the column of memory with which it is associated is not defective. The control circuitry 178 then applies a low to its inverter 176 so that the inverter outputs a voltage of Vccp. If the column is defective, the output of the control circuitry 178 is pulled high through the pull-up resistor 182, thereby causing the inverter 176 to output a low that turns off the coupling transistors 170, 172.

In a similar manner, if an anti-fuse 184 (FIG. 5B) is used in the control circuitry 178, the anti-fuse 184 is blown if the column of memory with which it is associated is not defective. If the column is defective, the anti-fuse 184 is left unblown, thereby allowing the output of the control circuitry 178 to be pulled high through the pull-up resistor 182.

In the embodiment of FIGS. 4A and 4B, the coupling transistors 170 coupled to the array 100 are operated in common with the coupling transistors 172 coupled to the array 102. However, it will be understood that separate control signals may be applied to the transistors 170, 172, respectively. Using this arrangement, a column node circuit 110' may be isolated from an array 100, is 102 containing a defective column of memory cells and continue to interface with the same column of memory cells in the other array. However, the amount and complexity of circuitry needed to provide separate control signals for the transistors 170, 172 may very well outweigh the advantages of being able to access a column of one array 100 or 102 when the corresponding column of the other array 102 or 100 is defective.

The routing of the signal lines to the coupling transistors 170, 172 in the embodiment of the invention shown in FIGS. 4A and 4B is expected to be fairly routine because the signal lines can be routed in parallel with the signal lines coupling the inverters 114 to the I/0 circuits 126. Moreover, the coupling transistors 170, 172, as well as the circuitry driving those transistors, can be relatively small since they do not need to couple a great deal of power. As a result, the circuitry for selectively decoupling the column node circuits 110' from the arrays 100, 102 uses relatively little surface area on the semiconductor die containing the memory device.

In an alternative embodiment, appropriate circuitry (not shown) is used to control the operation of the isolation transistors 150, 152 so all of the isolation transistors 150, 152 are non-conductive in the event a column of memory cells to which they are connected is defective. In addition to controlling the left isolation transistors 150 and the right isolation transistors 152 in all of the column node circuits 110' in two separate groups, the isolation transistors 150, 152 in each individual column node circuit 110' are also controlled on a column node-by-column node basis. However, the amount and complexity of circuitry that may be required to control the isolation transistors 150, 152 so that they perform both their original isolation function and the function of isolating column node circuits 110' from defective columns of memory cells may outweigh the value of eliminating the coupling transistors 170, 172 and their associated control circuitry.

Figure 1:
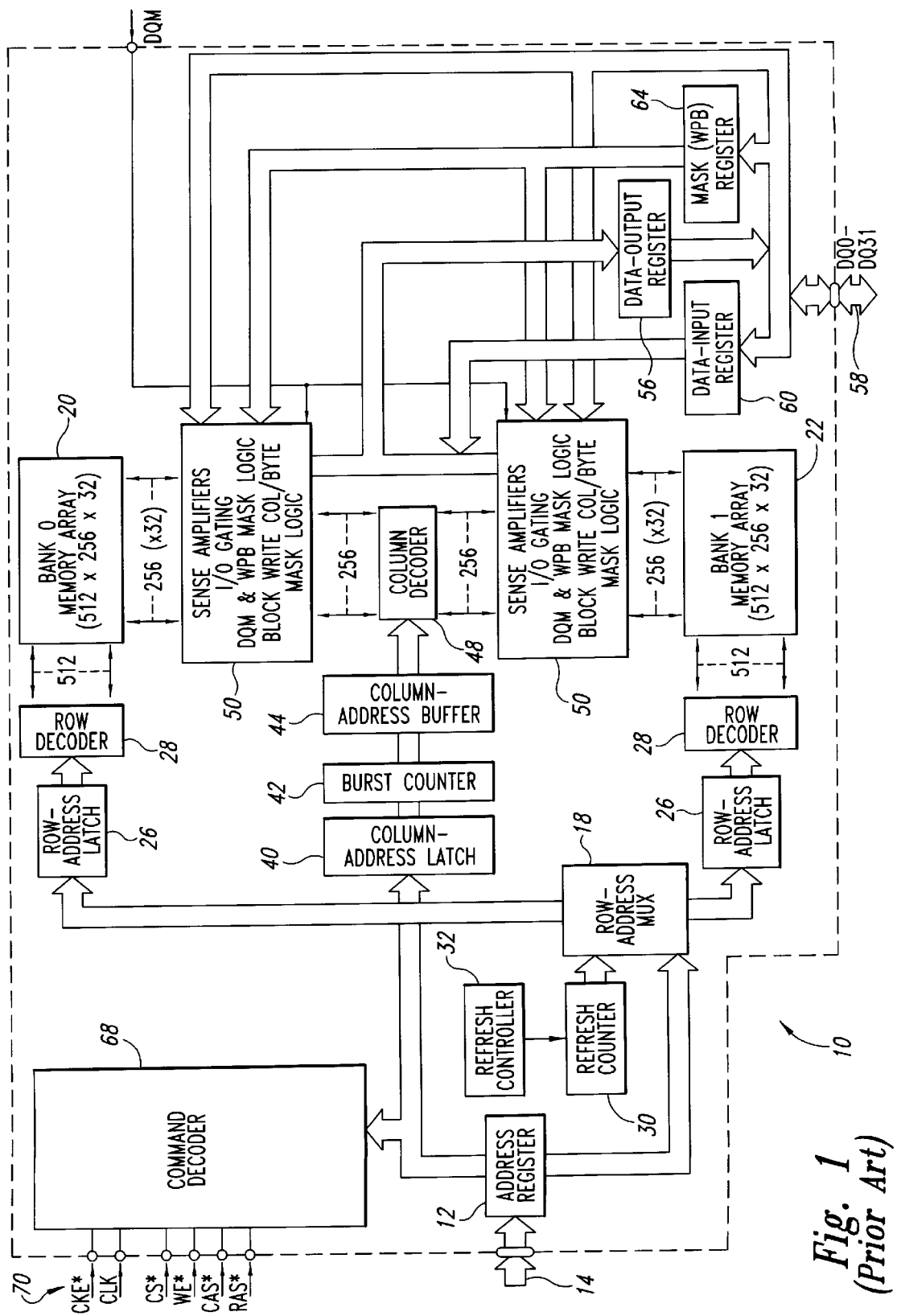
FIG. 1 is a block diagram of a conventional SDRAM.
Figure 6:
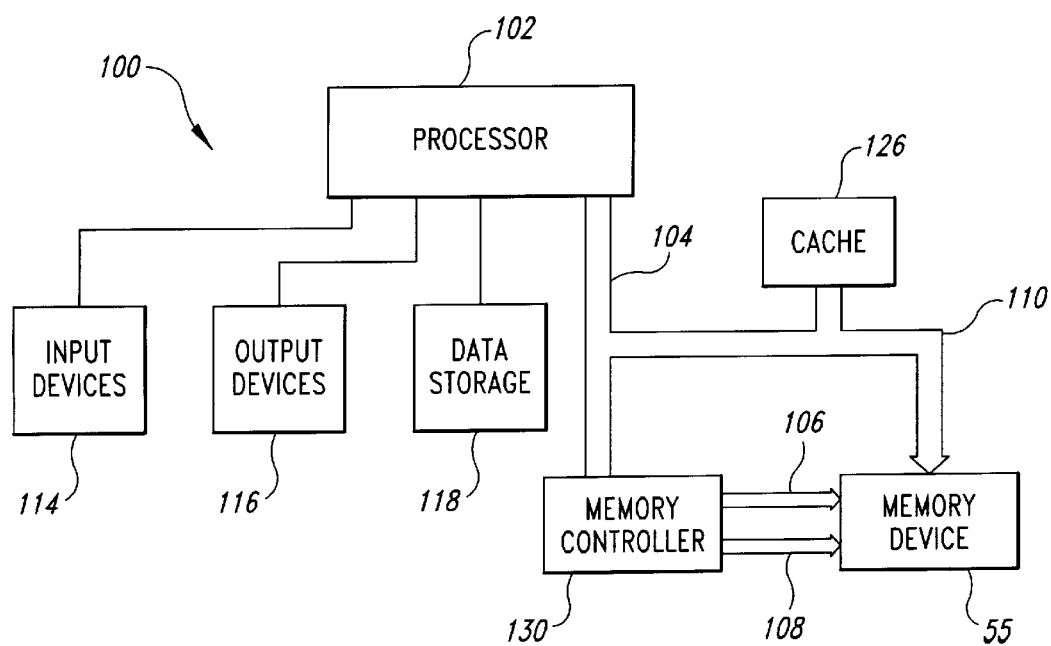
FIG. 6 is a block diagram of a computer system including the SDRAM of FIG. 1 containing the column circuitry of FIGS. 4A and 4B.

FIG. 6 is a block diagram illustrating a computer system 200 including the SDRAM 10' of FIG. 1 containing the column circuitry of FIGS. 4A and 4B. The computer system 200 includes a processor 202 for performing various computing functions, such as executing specific software to perform specific calculations or tasks. The processor 202 includes a processor bus 204 that normally includes an address bus 206, a control bus 208, and a data bus 210. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to store data or retrieve data from external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 10' through a memory controller 230. The memory controller 230 normally includes an address bus coupled to the address bus 14 (FIG. 1) and a control bus coupled to the control bus 70. The data bus 58 of the SDRAM 10' is coupled to the data bus 210 of the processor 202, either directly or through the memory controller 230.

From the foregoing it will be appreciated that, although specific embodiments of the invention have been described herein for purposes of illustration, various modifications may be made without deviating from the spirit and scope of the invention. For example, although the disclosed embodiment of the invention has been described as being coupled between two arrays of memory cells, it will be understood that it may be coupled to a single array of memory cells. Further, although the disclosed embodiment has been described for use in a SDRAM, it will be understood that it may be used in any present or future developed DRAM, including asynchronous DRAMs and packetized DRAMs, such as synchronous link DRAMs ("SLDRAMs") and RAMBUS DRAMs ("RDRAMs"). Accordingly, the invention is not limited except as by the appended claims.

What is claimed is:

1. A memory device, comprising
   a first array of memory cells arranged in rows and columns, the first array including at least one redundant column of memory cells;
   a control circuit structured to provide control signals for controlling the operation of the memory device responsive to command signals received by the memory device;
   a data path circuit structured to couple data between the first array and an externally accessible data bus, the data path circuit including at least one pair of complimentary input/output lines;
   a row address decoder decoding row addresses received by the memory device and activating a row of memory cells corresponding to the row address in the first array;
   a plurality of column node circuits each including at least one pair of complimentary digit lines, each of the column node circuits comprising:
      a sense amplifier coupled between each pair of the complimentary digit lines of the column node circuit;
      an equilibration circuit coupled between each pair of the complimentary digit lines of the column node circuit; and
      an input/output circuit coupled to each pair of the complimentary digit lines of the column node circuit, the input/output circuit being structured to couple each pair of complimentary digit lines of the column node circuit to a respective pair of complimentary input/output lines responsive to a column enable signal;
   a column address decoder decoding column addresses received by the memory device and to generate a plurality of the column enable signals, the column address decoder generating at least one of the column enable signals responsive to each of the column addresses;
   a pair of first coupling switches selectively coupling each pair of complimentary digit lines in each column node circuit to a pair of complimentary digit lines for a respective column in the first array, the first coupling switches having a conductive state determined by a respective column node disable signal;
   a second pair of coupling switches selectively coupling each pair of complimentary digit lines in each column node circuit to a pair of complimentary digit lines for a respective column in the second array, the coupling switches having a conductive state determined by the respective column node disable signal; and
   a redundant column control circuit applying a respective column node disable signal to the first coupling switches coupled to each of the column node circuits, each of the redundant column disable signals causing the first coupling switches coupled to the respective column node circuits to be non-conductive responsive to a redundant column of memory cells being substituted for the column of memory cells to which the column node circuit is coupled.

2. The memory device of claim 1, further comprising
   a second array of memory cells arranged in rows and columns, the second array including at least one redundant column of memory cells, the second array being coupled to the data path circuit to couple data to and from the second array, and to the row address decoder to activate a row of memory cells in the second array, a pair of second coupling switches selectively coupling each pair of complimentary digit lines in each column node circuit to a pair of complimentary digit lines for a respective column in the second array, the second coupling switches having a conductive state determined by a respective column node disable signal, the second coupling switches being coupled to the redundant column control circuit, the redundant column control circuit applying a column node disable signal to the second coupling switches coupled to each of the column node circuits, the redundant column disable signal causing the second coupling switches coupled to the respective column node circuits to be non-conductive responsive to a redundant column of memory cells being substituted for the column of memory cells to which the column node circuit is coupled.

3. The memory device of claim 2 wherein each of the column node circuits further comprises an isolation transistor coupled between each of the first and second coupling switches and a respective digit line of the column node circuit, and wherein the memory device further comprises an isolation control circuit coupled to the first and second coupling switches of all of the column node circuits, the isolation control circuit generating isolation control signals that cause either the first coupling switches or the second coupling switches, but not both, to be conductive.

4. The memory device of claim 3 wherein the isolation transistors and the coupling switches are separate components from each other.

5. The memory device of claim 2 wherein each of the column node circuits include a plurality of pairs of complimentary digit lines each of which is coupled to a pair of complimentary digit lines in the first array by one of the pairs of first coupling switches and to a pair of complimentary digit lines in the second array by one of the pairs of second coupling switches.

6. The memory device of claim 1 wherein each of the first coupling switches comprise a field effect transistor.

7. The memory device of claim 1 wherein each of the redundant column control circuits comprises a respective programmable impedance element having a conductive state and a non-conductive state.

8. The memory device of claim 7 wherein each of the programmable impedance elements comprises a laser fuse.

9. The memory device of claim 7 wherein each of the programmable impedance elements comprises an anti-fuse.

10. The memory device of claim 1 wherein the memory device comprises a dynamic random access memory.

11. The memory device of claim 10 wherein the memory device comprises a synchronous dynamic random access memory.

12. The memory device of claim 1 wherein the column enable signal coupled to each of the column node circuits and the redundant column disable signal applied to the first coupling switches for the associated column node circuit are coupled through respective conductors that are positioned in parallel with each other.

13. A column circuit adapted for coupling to a first array of memory cells arranged in rows and columns, the column circuit comprising:

a plurality of column node circuits each including at least one pair of complimentary digit lines, each of the column node circuits comprising:

a sense amplifier coupled between each pair of the complimentary digit lines of the column node circuit;

an equilibration circuit coupled between each pair of the complimentary digit lines of the column node circuit; and an input/output circuit coupled to each pair of the complimentary digit lines of the column node circuit, the input/output circuit being structured to couple the pair of complimentary digit lines of the column node circuit to a pair of complimentary input/output lines, respectively, responsive to a column enable signal;

a pair of first coupling switches selectively coupling each pair of the complimentary digit lines in each column node circuit to respective pairs of complimentary digit lines in the first array, the switches having a conductive state determined by a respective column node disable signal; and a redundant column control circuit applying respective column node disable signals to the first coupling switches in each of the column node circuit, each of the redundant column disable signals causing the first coupling switches coupled to the respective column node circuits to be non-conductive responsive to a redundant column of memory cells being substituted for the column of memory cells to which the column node circuit is coupled.

14. The column circuit of claim 13 wherein the column circuit is coupled to a second array of memory cells arranged in rows and columns, the column circuit further comprising a pair of second coupling switches coupled to each pair of the complimentary digit lines in each column node circuit to respective pairs of complimentary digit lines in the second array, the switches having a conductive state determined by a respective column node disable signal, the second coupling switches being coupled to the redundant column control circuit, the redundant column control circuit applying a column node disable signal to the second coupling switches coupled to each of the column node circuits, the redundant column disable signal causing the second coupling switches coupled to the respective column node circuits to be non-conductive responsive to a redundant column of memory cells being substituted for the column of memory cells to which the column node circuit is coupled.

15. The column circuit of claim 14 wherein each of the column node circuits further comprises an isolation transistor coupled between each of the first and second coupling switches and a respective digit line of the column node circuit.

16. The column circuit of claim 15 wherein the isolation transistors and the first and second coupling switches are separate components from each other.

17. The column circuit of claim 14 wherein each of the column node circuits include a plurality of pairs of complimentary digit lines each of which is coupled to a pair of complimentary digit lines in the first array by one of the pairs of first coupling switches and to a pair of complimentary digit lines in the second array by one of the pairs of second coupling switches.

18. The column circuit of claim 13 wherein each of the first coupling switches comprise a field effect transistor.

19. The column circuit of claim 13 wherein each of the redundant column control circuits comprises a respective programmable impedance element having a conductive state and a non-conductive state.

20. The column circuit of claim 19 wherein each of the programmable impedance elements comprises a laser fuse.

21. The column circuit of claim 19 wherein each of the programmable impedance elements comprises an anti-fuse.

22. The column circuit of claim 13 wherein the column enable signal coupled to each of the column node circuits and the redundant column disable signal applied to the first coupling transistors for the associated column node circuit are coupled through respective conductors that are positioned in parallel with each other.

23. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device, comprising
a first array of memory cells arranged in rows and columns, the first array including at least one redundant column of memory cells;
a control circuit structured to provide control signals for controlling the operation of the memory device responsive to command signals received by the memory device;
a data path circuit structured to couple data between the first array and an externally accessible data bus, the data path circuit including at least one pair of complimentary input/output lines;
a row address decoder decoding row addresses received by the memory device and activating a row of memory cells corresponding to the row address in the first array;
a plurality of column node circuits each including at least one pair of complimentary digit lines, each of the column node circuits comprising:
a sense amplifier coupled between each pair of the complimentary digit lines of the column node circuit;
an equilibration circuit coupled between each pair of the complimentary digit lines of the column node circuit; and
an input/output circuit coupled to each pair of the complimentary digit lines of the column node circuit, the input/output circuit being structured to couple each pair of complimentary digit lines of the column node circuit to a respective pair of complimentary input/output lines responsive to a column enable signal;
a column address decoder decoding column addresses received by the memory device and to generate a plurality of the column enable signals, the column address decoder generating at least one of the column enable signals responsive to each of the column addresses;
pairs of first coupling switches selectively coupling each pair of complimentary digit lines in each column node circuit to a pair of complimentary digit lines for a respective column in the first array, the first coupling switches having a conductive state determined by a respective column node disable signal;
a second pair of coupling switches selectively coupling each pair of complimentary digit lines in each column node circuit to a pair of complimentary digit lines for a respective column in the second array, the coupling switches having a conductive state determined by the respective column node disable signal; and
a redundant column control circuit applying a respective column node disable signal to the first coupling switches coupled to each of the column node circuits, each of the redundant column disable signals causing the first coupling switches coupled to the respective column node circuits to be non-conductive responsive to a redundant column of memory cells being substituted for the column of memory cells to which the column node circuit is coupled.

24. The computer system of claim 23 wherein the memory device further comprises:
a second array of memory cells arranged in rows and columns, the second array including at least one redundant column of memory cells, the second array being coupled to the data path circuit to couple data to and from the second array, and to the row address decoder to activate a row of memory cells in the second array,
a pair of second coupling switches selectively coupling each pair of complimentary digit lines in each column node circuit to a pair of complimentary digit lines for a respective column in the second array, the second coupling switches having a conductive state determined by a respective column node disable signal, the second coupling switches being coupled to the redundant column control circuit, the redundant column control circuit applying a column node disable signal to the second coupling switches coupled to each of the column node circuits, the redundant column disable signal causing the second coupling switches coupled to the respective column node circuits to be non-conductive responsive to a redundant column of memory cells being substituted for the column of memory cells to which the column node circuit is coupled.

25. The computer system of claim 24 wherein each of the column node circuits further comprises an isolation transistor coupled between each of the first and second coupling switches and a respective digit line of the column node circuit, and wherein the memory device further comprises an isolation control circuit coupled to the first and second coupling switches of all of the column node circuits, the isolation control circuit generating isolation control signals that cause either the first coupling switches or the second coupling switches, but not both, to be conductive.

26. The computer system of claim 24 wherein the isolation transistors and the coupling switches are separate components from each other.

27. The computer system of claim 24 wherein each of the column node circuits include a plurality of pairs of complimentary digit lines each of which is coupled to a pair of complimentary digit lines in the first array by a first coupling switch and to a pair of complimentary digit lines in the second array by a second coupling switch.

28. The computer system of claim 23 wherein each of the coupling switches comprise a field effect transistor.

29. The computer system of claim 23 wherein each of the redundant column control circuits comprises a respective programmable impedance element having a conductive state and a non-conductive state.

30. The computer system of claim 29 wherein each of the programmable impedance elements comprises a laser fuse.

31. The computer system of claim 29 wherein each of the programmable impedance elements comprises an anti-fuse.

32. The computer system of claim 23 wherein the memory device comprises a dynamic random access memory.

33. The computer system of claim 32 wherein the memory device comprises a synchronous dynamic random access memory.

34. The computer system of claim 23 wherein the column enable signal coupled to each of the column node circuits and the redundant column disable signal applied to the first coupling transistors for the associated column node circuit are coupled through respective conductors that are positioned in parallel with each other.

35. A method of coupling data signals between of a plurality of pairs of complimentary digit lines in a first array of memory cells and a plurality of column circuits, the method comprising:

coupling the data signals between at least one pair of complimentary digit lines in each column circuit and corresponding pairs of complimentary digit lines in the first array, in the event the digit lines in the first array are not defective; and isolating the first array from a column circuit if any digit lines in the first array corresponding to digit lines in the column circuit are defective.

36. The method of claim 35 wherein the data signals are coupled between the column circuits and a plurality of pairs of complimentary digit lines in a second array of memory cells, the method comprising:

coupling the data signals between at least one pair of complimentary digit lines in each column circuit and corresponding pairs of complimentary digit lines in the second array in the event the digit lines in the second array are not defective; and isolating the second array from the column circuit if any digit lines in the second array corresponding to digit lines in the column circuit are defective.

37. The method of claim 34 further comprising substituting a pair of complimentary digit lines for the pair of complimentary digit lines in the first array that are defective.

38. The method of claim 35 wherein the memory device comprises a dynamic random access memory.

39. The method of claim 38 wherein the memory device comprises a synchronous dynamic random access memory.

40. The method of claim 35 wherein each of the column circuits comprises two pairs of complimentary digit lines.

* * * * *

UNITED STATES PATENT AND TRADEMARK OFFICE
CERTIFICATE OF CORRECTION

PATENT NO. : 6,185,136 B1  
DATED : February 6, 2001  
INVENTOR(S) : Brian M. Shirley It is certified that error appears in the above-identified patent and that said Letters Patent is hereby corrected as shown below:

Title page,
ABSTRACT, line 5, "complimentary" should read -- complementary --

Column 8,
Lines 16, 22, 25, 27, 30, 32, 33, 43, 44 and 50, "complimentary" should read -- complementary --

Column 9,
Lines 6, 7, 36, 68, 39 and 67, "complimentary" should read -- complementary --

Column 10,
Lines 2, 4, 7, 10, 13, 14, 31, 32, 53, 55 and 56, "complimentary" should read -- complementary --

Column 11,
Lines 25, 32, 35, 38, 41, 43, 45, 54, 55, 61 and 62, "complimentary" should read -- complementary --

Column 12,
Lines 18, 19, 48, 50 and 51, "complimentary" should read -- complementary --

Column 13,
Lines 8, 12 and 13, "complimentary" should read -- complementary --

Column 14,
Lines 1, 4, 5, 12, 13 and 19, "complimentary" should read -- complementary --

Signed and Sealed this

Thirtieth Day of April, 2002

*Attest:*

JAMES E. ROGAN  
*Attesting Officer*   *Director of the United States Patent and Trademark Office*